United States Patent [19]

Griffin

[11] 3,993,993

[45] Nov. 23, 1976

[54] DIGITAL-TO-SYNCHRO CONVERTER

[75] Inventor: Earl Harris Griffin, Los Angeles, Calif.

[73] Assignee: RCA Corporation, New York, N.Y.

[22] Filed: Mar. 17, 1975

[21] Appl. No.: 559,099

Related U.S. Application Data

[63] Continuation of Ser. No. 304,525, Nov. 7, 1972, abandoned.

[30] Foreign Application Priority Data

June 6, 1972 United Kingdom............... 26274/72

[52] U.S. Cl. ..................... 340/347 SY; 340/347 DA
[51] Int. Cl.[2] ........................................ H03K 13/02
[58] Field of Search .............. 340/347 SY, 347 DA; 235/186, 189; 318/569, 594, 600, 659, 660

[56] References Cited
UNITED STATES PATENTS

| | | | |
|---|---|---|---|
| 2,998,560 | 8/1961 | Mottu ........................... | 340/347 SY |
| 3,039,030 | 6/1962 | Weidner........................ | 340/347 DA |
| 3,051,942 | 8/1962 | Galman......................... | 340/347 DA |
| 3,196,430 | 7/1965 | Oken et al. ................... | 340/347 SY |
| 3,457,395 | 7/1969 | Wisniewski.................... | 235/189 |
| 3,488,653 | 1/1970 | Rasche.......................... | 340/347 DA |
| 3,553,647 | 1/1971 | Bullock......................... | 340/347 SY |
| 3,731,300 | 5/1973 | Greutman et al......... | 340/347 SY X |

Primary Examiner—Thomas J. Sloyan
Attorney, Agent, or Firm—Edward J. Norton; Joseph D. Lazar

[57] ABSTRACT

A digital-to-synchro converter accepts digital distance data comprising either a binary coded decimal (BCD) signal or a train of pulses of any desired format. The converter comprises a digital-to-synchro converter whose output represents the distance data that controls a signal generator synchronized to a sinusoidal reference voltage. The signal generator output are pulses representing sample and hold control signals which are applied to a sample and hold circuit. The sine wave is sampled by the sample and hold circuit, and the output is a DC voltage that is proportional to the sine of the desirable synchro rotation angle. This voltage is applied to an analog multiplier for generating the controlling signals which are then amplified before being routed to provide distance measurements at the synchro receiver.

4 Claims, 4 Drawing Figures

DIGITAL-TO-SYNCHRO CONVERTER

This is a continuation of application Ser. No. 304,525, filed Nov. 7, 1972 now abandoned.

BACKGROUND OF THE INVENTION

1. Field of the Invention

This invention relates to digital-to-synchro conversion units for converting the digital input data from a DME (Distance Measuring Equipment) to synchro output voltages, and more particularly, it relates to digital-to-synchro converters of the type for providing continuous-real-time indications in angular form representing distance.

2. Description of Prior Art

With the advent and extensive use of digital circuits to implement systems that heretofore were primarily of the analogue type, a need has grown to provide digital-to-analogue converters. The indicators of the older type analogue equipment were obviously of the analogue type. In many aircraft installations, one need only replace both the analogue equipment and its associated indicator with modern digital equipment. There are cases, however, when this is not possible. The analogue indicator, for instance, may be part of a "flight director," an apparatus usually associated with an automatic aircraft controller that displays both the aircraft attitude and the outputs of the navigation instruments. The distance indicator for the flight director is usually an analogue unit that employs three synchro receivers. When a digital DME is used, the flight director is so expensive that it is cheaper to use a digital-to-analogue converter rather than remove and redesign its DME indicator.

Although the D/A conversion art is quite advanced satisfying the requirements of the avionics industry for units that are both accurate and inexpensive, there still remains difficult problems. Conventional units are large, expensive, and are complex. One solution, described in U.S. Pat. No. 3,662,379, uses tapped transformers and relays. Several transformers and relays are required for only one digit, noting that synchro indicators usually require three digits.

Another solution, described in the periodical "Electronics," Oct. 26, 1970, page 95, requires a conversion of the digital information-to-resolver signal as illustrated in FIG. 4 thereof. Resolver signals, however, are not compatible with synchros, and therefore, additional converter steps are required in order to develop the synchro signals. Known digital-to-synchro units require an input that is angle binary.. "Angle binary" relates angles by multiples of two. Thus, a rotation of 180° is followed by 90°, 45° steps in rotation for the most significant bit (MSB). The most significant bit (MSB) of such codes requires digital-to-digital converters at the input and a power type synchro device at the output. Also angle binary codes are not compatible with a conventional DME distance indicator since rotations are required in steps of either 36° or 3.6°. One must select, therefore, from the angle binary code those bits that provide the proper rotation. Such digital-to-digital converters would result in complex circuits. There is a need, therefore, for a digital-to-synchro converter that overcomes the problems of the known converters discussed above.

SUMMARY OF THE INVENTION

According to the present invention a digital-to-synchro converter is arranged to receive input data in the form of digital signals representing distance, the digital signals comprising at least two sets of signals each representing two adjacent figures of a decimal representation of the distance preferably the two lowest significant figures thereof. Means are provided, if necessary, for converting and, if desired, storing the received digital signals. A reference signal, suitably a sinusoidal voltage, is used to control, gate, and initiate the several component circuits for processing the digital data. A means is provided for releasing the stored signals in response to the reference signal, the stored signals being delayed and subsequently released after a variable and fixed delay. Two output signals are generated having a predetermined phase relationship whose amplitudes represent the respective distance values of said two figures. The two output signals are multiplied by a reference signal to generate a control signal for operating a synchro receiver having a rotor whose angular displacement is proportional to the linear position represented by the two adjacent figures representative of the distance data.

DETAILED DESCRIPTION OF PREFERRED EMBODIMENTS

The converter of the invention is arranged to convert digital format signals, such as a binary coded decimal (BCD) either in parallel or serial form, or signals in the form of a pulse train at a rate suitable for conversion to distance measurements manifested for synchro receiver signals for driving a three-wire synchro receiver to display, for example, distance represented by the digital signals. One form of the invention utilizes solid-state electronic components for portions of the digital-to-synchro converter. The converter transforms or converts the signals into a form compatible with three-wire synchro receiver stator windings and the associated rotor windings for use in driving mechanical displays or indicators. by suitable electronic circuits, the distance data provided in any chosen one of the digital formats, as provided by suitable distance measuring equipment, is converted to an equivalent range display on a synchro type indicator.

An example of such suitable equipment is the AVQ-85 DME, a type of distance measuring equipment manufactured by the RCA Corporation. The AVQ-85 DME provides a digital seven-segment range display. However, a standard flight director which displays both the attitude and orientation of the aircraft as well as the outputs of the navigation instruments, usually has a distance display which accepts only distance data with a synchro type format. A digital-to-synchro type converter is, therefore, required in order for the new digital DME equipment to drive such a flight director.

The present embodiment will illustrate the use of the invention with parallel BCD digital data. It will be understood, however, to those skilled in the art, that the use of a suitable digital converter at the input will allow for the receipt of other types of digital formats such as serial binary or other types of pulse trains as will be discussed in consideration of FIG. 4.

Figure 1:
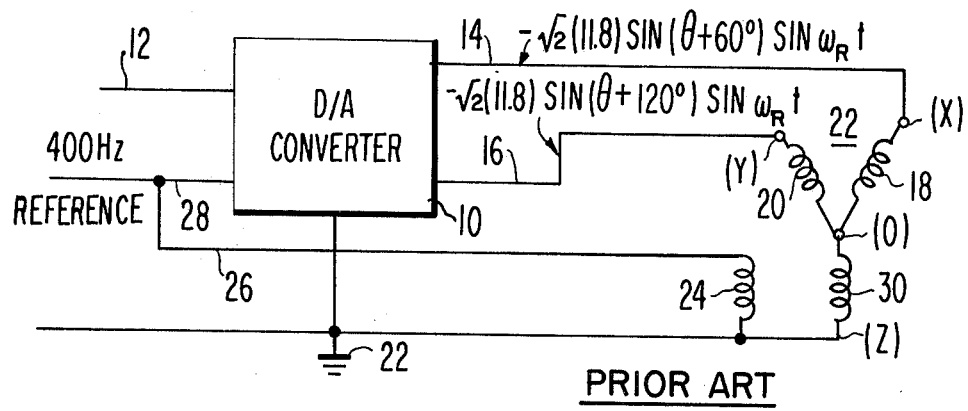
FIG. 1 is a simplified schematic of a digital-to-synchro converter.

A conventional three-synchro distance read-out is used to provide the distance indications in nautical miles, including tenths of a mile. Preliminary to a detailed description of the present embodiment of the invention, reference is made to FIG. 1 wherein a digital-to-synchro transmitter is coupled to a single synchro receiver. FIG. 1, it should be understood, represents any system that serves to utilize digital data to operate a synchro. A description of such a system will provide a basis for a better understanding of the present invention. A digital-to-analogue converter 10 receives digital input position command signals over path 12. The D/A converter 10 provides synchro signals over path 14 and 16 to windings 18 (X-0) and 20 (Y-0) of the synchro stator windings of a synchro receiver 22. The rotor windings 24 of the synchro receiver 22 are energized by a reference voltage, suitably 400 Hz, at 26 volts, over path 26. The reference voltage is also provided as an input to the D/A converter 10 over path 28. The third winding, 30 (Z-0) of the synchro receiver 22, is grounded at 22 common with one end of the rotor 24. The stator windings 18, 20, and 30 are mounted so as to be spacially separated 120° apart as schematically shown in FIG. 1, the rotor 24 rotating with respect to the fixed stator windings in a manner well known in the art. When the rotor position relative to the stator windings is parallel with any one of the respective windings of the stator, for example, when the rotor is vertical, that is, 0°, a maximum voltage will be induced in the stator winding 30 (Z-0). Similarly, when the rotor assumes a position of +60°, being thereby parallel with the stator winding 18 (X-0), a maximum voltage will be induced in winding 18. Also, when the rotor 24 is in a position 180° from those just described, a maximum voltage of the opposite polarity will be induced in the stator windings. The rotor coil 24 and the stator winding 30 (Z-0) are connected together and to ground as shown. The amplitude factors for $\theta°$ of rotation may be represented by:

$$V_{xz} = -\sqrt{2} \, (11.8) \sin (\theta + 60°) \quad (1)$$

$$V_{yz} = -\sqrt{2} \, (11.8) \sin (\theta + 120°) \quad (2)$$

Equations (1) and (2) represent the amplitude of the 400 Hz stator excitation signals, across the stator windings, 18 and 30, in series, and 20 and 30, in series, respectively.

In operation, the application of the reference voltage over path 26 and the simultaneous application of the digital input signal over path 12 causes the rotor 24 to assume the position corresponding to the digital distance of the data. Thus, an indicator of the angular position of the rotor 24 is coupled to a wheel onto which the desired numbers (0, 1, 2, etc.) are stamped in a manner corresponding to the digital data and calibrated to a read-out scale in distance. In order to increase the resolution or accuracy of the digital data, the indicator is formed of three rotors (24), each corresponding to a different digital position of the numeric representation of the distance. Thus, for a distance measuring system providing distance data to a maximum of 299.9 nautical miles, a first rotor provides distances of 0 to 200 nautical miles (N.M.) in 100 N.M. steps. A second synchro provides read-outs between 0 and 90 N.M. in 10 N.M. steps, and a third synchro provides an indication between 0 and 9.9 N.M. in 0.1 N.M. steps.

Figure 2:
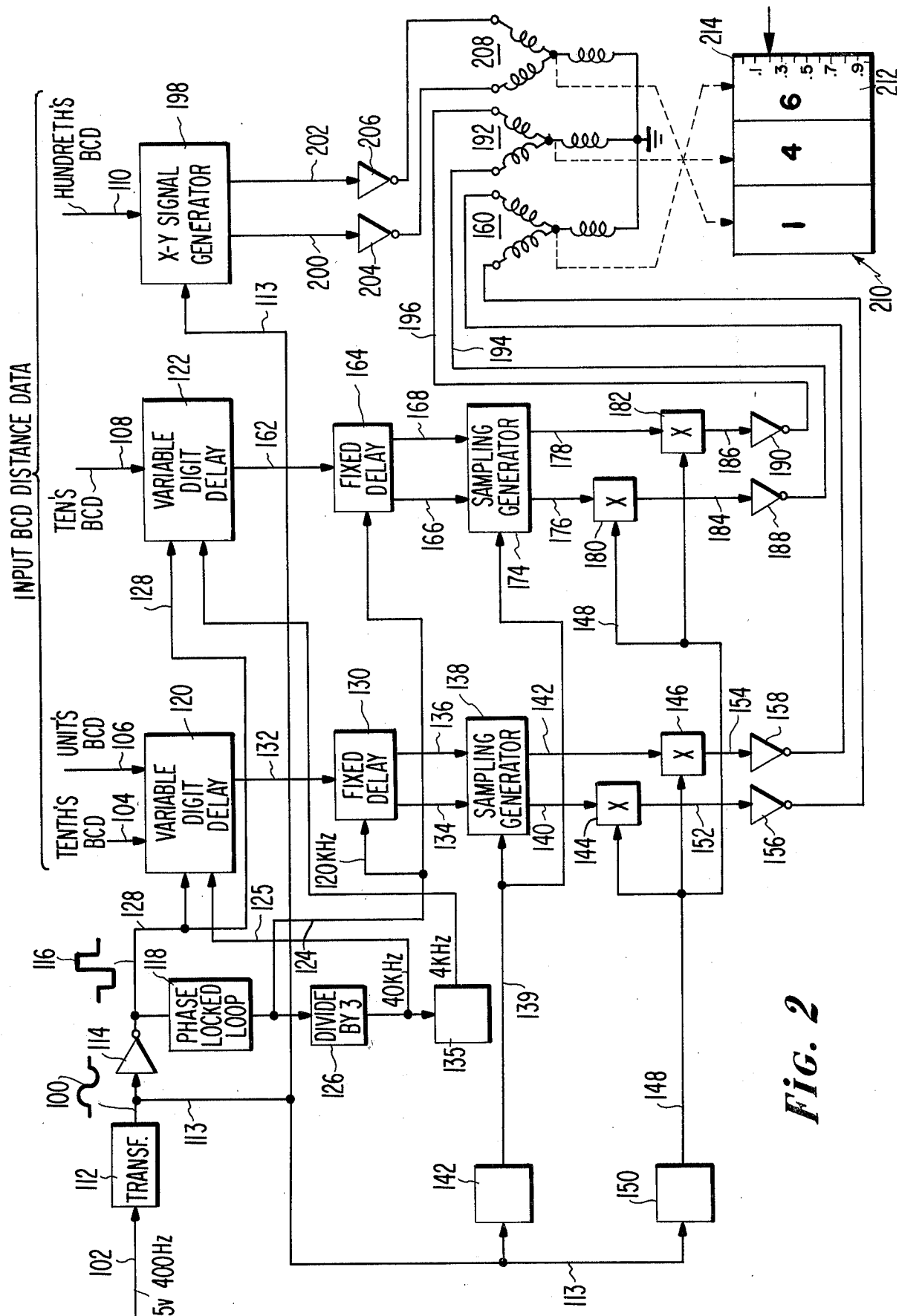
FIG. 2 is a block diagram of a digital-to-synchro converter according to the present invention.

The arrangement and organization of the present invention is illustrated by the embodiment illustrated in FIG. 2. In general, the invention provides for the receipt of incoming digital formated signals preferably in parallel form representing the distance determined by suitable apparatus of conventional form not shown or described further. The present description contemplates the digital formated signals in such form as to have each of the digits representing the distance received simultaneously, or as is known in the art, parallel format. Suitable converters are contemplated wherein such signals are received thus in serial or parallel form.

The incoming signals are stored in such an arrangement that the outputs of the storage elements comprise four groups of four wire binary coded decimal (BCD) numbers. Each group of the four, except the third and fourth group, represent one of the three digits of a three digit distance indication of conventional decimal number form, and as such each group represents the angular rotation that the synchro should be rotated. The third and fourth groups of the digital formated signals are combined and processed in integrated circuits to position a third synchro, whose rotation is proportional to the two integers representing the third digit and fractional figures. The capacity of one form of a synchro arrangement is 299.9 nautical miles.

The first digit of the four significant digits of the range in digital format represents the most significant hundred's place digit of the distance data. For the embodiment to be described, this digit would thus be manifested by 0, 1, or 2, for indications of 000.0 to 299.9 nautical miles (N.M.). The manner in which the conversion of BCD data is converted to synchro form for such numerical values is well known in the art and will not be described in any detail. See, for example, U.S. Pat. No. 3,553,647 issued to Bullock on Jan. 5, 1971, particularly FIG. 12 thereof describing the use of transmission gates or switches to generate such appropriate synchro control voltages.

Figure 3:
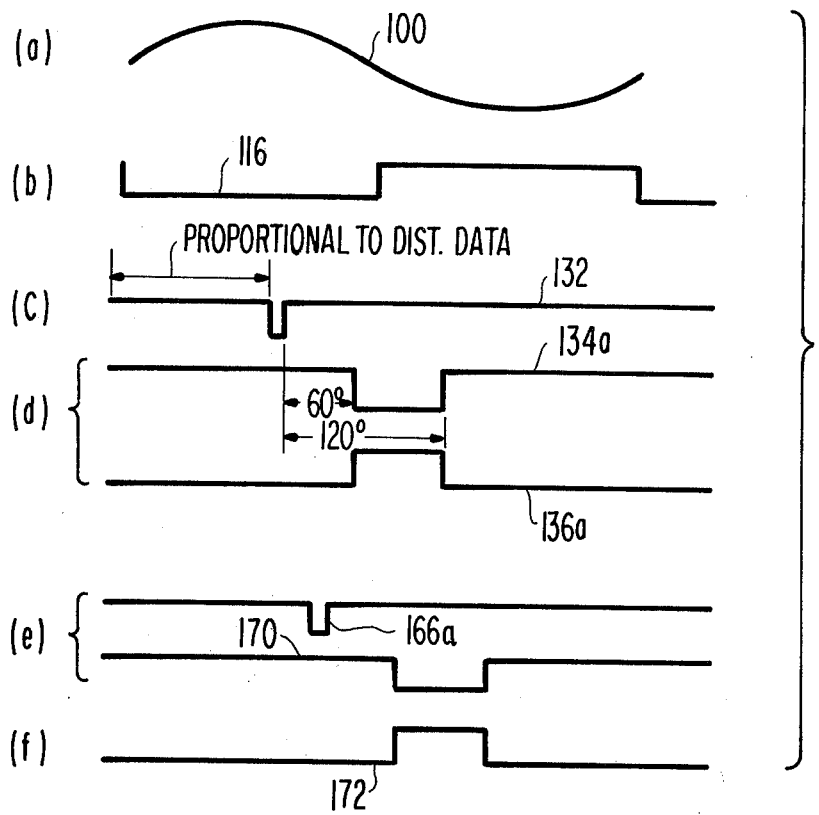
FIG. 3 is a timing diagram showing the several signals and pulses that are developed during the operation of the converter of the invention.

The other two significant digits, namely, the digits representing the ten's and the unit's place and fractional portions (tenth's) thereof, each respectively, control a variable digital delay circuit that is arranged to be proportional to the magnitude of that digit. The digital delay circuit is preferably referred to a 400 Hz signal and is also triggered into operation by that 400 Hz signal, such signal sources being of the type usually used in conventional aircraft systems. The variable delay that is provided for the incoming pulse representative of the digital formated signals in turn is utilized to initiate a fixed delay generator having two outputs each delayed respectively 60° and 120°. The delays of 60° and 120° correspond to the required inputs to a three phase synchro as explained above whereby the resolved output manifested by the rotation of the rotor of the synchro receiver assumes a position corresponding to the amplitude of the two outputs of the fixed delay generator. The wave form of the reference signal [FIG. 3 (a)], to be described, is sampled at the end of all of the delays, that is, at the end of both the variable and the fixed delay. The output of the sampler is the two DC voltages. These two voltages are propotional to:

$$\sin(36N + 60) \qquad (3)$$

$$\sin(3.6M + 120) \qquad (4)$$

where N equals the ten's place of the BCD distance number and M is a function of the 1.0 and 0.1 of the BCD distance number in combined form, that is, the two least significant figures. Thus, more generally, the unit's and tenth's place of the BCD numbers are P and Q respectively, whereby $M = 1QP + Q$.

The two DC output voltages whose respective amplitudes are proportional to the functions represented by equations 3 and 4 above are utilized as one input of a two input analogue multiplier. The reference signal (FIG. 3a) is applied to the other input of the analogue multiplier. The multiplier output is, therefore, equal to:

$$X = -\sqrt{2}(11.8)\sin[(36N + 60)]\sin\omega_R t \qquad (5)$$

$$Y = -\sqrt{2}(11.8)\sin[(3.6M + 120)]\sin\omega_R t \qquad (6)$$

where $\sin \omega_R t$ represents the reference signal (FIG. 3a) such as the 400 Hz signal. The wave forms on paths 14 and 16 of FIG. 1 are represented by signals represented by equations (5) and (6). It is to be noted that 36 N and 3.6 M represents, respectively, the desired amount of synchro rotation in degrees corresponding to the ten's place and the unit's place (including the decimal portions of the unit figure).

In FIG. 2, the two primary inputs are the 400 Hz reference voltage 100 (FIG. 3a) over path 102 and the parallel BCD distance data over paths 104, 106, 108, and 110. The reference signal 100 (400 Hz at 26 volts) is obtained from a 115 volt, 400 Hz source through a transformer 112, while the parallel BCD distance data may be derived suitably from a digital converter, not shown. The reference signal 100 is amplified by a square wave amplifier 114 to form a reference square wave 116 (FIG. 3b) that is applied to a phase locked loop 118 and to two variable digital delay circuits 120 and 122 through path 128. A suitable circuit serving as either of the detector delay circuits 120 and 122 is a down counter such as the MC4016 ripple-down counter available from the Motorola Semiconductor Products, Inc. An illustrative use of such a counter responding to BCD inputs is described in Motorola Application Note AN-532A. The phase locked loop 118 uses well known techniques to develop a 120 kHz clock over path 124 that is phase locked to the 400 Hz reference signal 100. The 120 kHz clock signal over path 124 provides the basic interval for determining all delays. Each delay is therefore referenced to the 400 Hz signal through the phase locked loop 118.

The variable delay unit 120 receives the tenth's place range data over path 104, and the unit's place range data over path 106. A 40 kHz clock signal is received over path 125 from a divide-by-three circuit 126. The divide-by-three circuit 126 receives its input from the phase locked loop 118 whose output is the 120 kHz clock signal. Delay unit 120 also receives the square wave reference pulse 116 over path 128. The delay voltage from the variable delay unit 120 is started by the falling edge of the square wave 116. The 40 kHz clock signal over path 125 is used as the delay measuring interval, while the unit's range data over path 106 and the tenth data over path 104 determine the amount of the delay. Each tenth of the distance data represents one clock pulse of delay which is equivalent to 3.6° of angular rotation. Each unit of distance data represents ten clock pulses of delay corresponding to 36° of rotation. The output of the variable delay 120 is applied to a fixed delay circuit 130 over path 132. After the delay has been introduced by the delay circuit 120, the fixed delay circuit 130 is then energized after being gated by the 120 kHz clock pulse over path 124. The outputs of the fixed delay 130 are signals over path 134 and 136 that represents additional delays of 60° and 120°.

The fixed digital delay module 130 receiving the 120 kHz input from divider circuit (phase locked loop) 118 over path 124 provides two signals 134a and 136a (FIG. 3d), 180° out of phase with each other. The falling edge of one of the two signals (134a) is delayed 60° following the variable delay pulse over path 132, the other signal being determined by the falling edge of the other signal 136a which is delayed 120° over path 136, the falling edges of each of the two signals 134a and 136a triggering a sampling generator 138. The sampling generator 138 is also provided with a filtered 400 Hz signal over path 139 which signal is filtered to avoid possible jitter by a suitable filter 142. It is this filtered 400 Hz signal over path 140 which is utilized for sampling purposes according to the invention.

The output of the sampling generator 138 is a pair of DC signals fed over paths 140 and 142 that are respectively applied to analogue multipliers 144 and 146. The multipliers each receive the 400 Hz reference signal over path 148 which has been suitably attenuated by an attenuator 150 from the signal reference bus 113 for the 400 Hz signal. The true products of the multipliers are applied over paths 152 and 154 to power amplifiers 156 and 158 whose outputs respectively drive the stators of the synchro receivers 160. The voltage for the synchro rotor (not shown) is suitably derived from transformer 112.

The operation of the ten's place of the input distance data is similar to that for the unit's place just described. The inputs of the ten's digit variable delay 122 are the ten's BCD distance data over path 108. The reference square wave 116 is applied to delay 122, as well as the output of clock source 135 at a rate of 4 kHz. The 4 kHz clock rate is required since the ten's digit advances in ten nautical mile steps. Each step represents one tenth of a rotation of the rotor, or 36°, whereas the unit's synchro must resolve one hundredths of a rotation (3.6°) which requires a 40 kHz clock. The ten's place clock, therefore, need only be 4 kHz. Specifically, one period of the 4 kHz clock represents one tenth of the 400 Hz clock period or 36°.

The ten's place variable digit delay circuit 122 introduces a delay of 36N° where N is the value of the ten's BCD data applied over path 108. Thus, for example, a range of 146.2 nautical miles includes a value of 4 for N (the ten's BCD number), 6 for the unit's BCD number 4, and two for the tenth BCD number 3. In general, the output of the ten's variable delay 122 is a pulse 166a (FIG. 3 (e)) fed over path 162 which initiates the ten's place fixed delay module 164. Delay circuit 164 also is provided with the 120 kHz clock signal over path 124 from the output of the phase locked loop 118. The output of the fixed delay 164 is two pulses whose falling edges are respectively delayed 60° and 120° over paths 166 and 168, relative to the phase of the variable delay pulse 166. See Figures e and f wherein these two pulses (180° out-of-phase) are represented in the timing diagram as pulses 170 and 172 compared to pulse 166.

The fixed delay output pulses 170 and 172 initiate the sampling generator, suitably a sample and hold circuit, 174 which is also provided with the filtered 400 Hz reference signal over path 139 which is coupled, as previously explained, over bus 113 through the filter 142. Specifically, a falling edge of a pulse on either path 166 or 168 will cause the voltage on path 139 to be sampled, resulting in a DC voltage being developed on paths 176 and 178. Each of these DC voltages is applied to an analogue multiplier 180 and 182, respectively. These multipliers are also provided with the reference 400 Hz signal over path 148 after attenuation by the attenuator 150, as previously explained. The output of the multipliers 180 and 182 are fed over paths 184 and 186 to power amplifiers 188 and 190 which in turn energize the ten's synchro 192 over paths 194 and 196, respectively. The rotor of this synchro, as well as the others, as has been described, is energized from transformer 112.

The operation of the hundred's place nautical mile digit circuit of BCD data received over 110 is somewhat different. Only three positions are required for one form of the invention wherein the range capacity of operation is 299.9 nautical miles. Therefore, only three discrete positions are required. The most significant position is 0 for distances less than 100 nautical miles, 1 for 100 to 199.9 nautical miles, and 2 for 200 to 299.9 nautical miles.

Discrete steps, effected by solid state FET devices, in the hundredth's place of nautical miles are generated by a suitable X–Y signal generator 198 which modulates the 400 Hz sine wave 100, on path 113 based on the BCD data for the hundredth's figure received over path 110. A circuit serving as a suitable generator 198 is illustrated, for example, in the above-mentioned U.S. Pat. No. 3,553,647. This data as previously described is representative of the hundredth's distance 0, 1, or 2. The modulated output of the signal generator 198 provides the synchro control signals of paths 200 and 202 to power amplifiers 204 and 206 to develop the hundred nautical mile synchro stator voltages for energizing the synchro receiver 208, the rotor of which is energized in the manner previously described. The converted output of 146.2 nautical miles is shown indicated in the indicator 210. The tenths of a nautical mile (i.e., 0.2) is indicated by a subdivision of the units wheel 212 as shown by reference numeral 214. The rotor effecting rotation of the digit wheel 212 advances incrementally in tenths of a nautical mile depending upon rotation of the rotor in response to signals applied to the synchro receiver 160.

Figure 4:
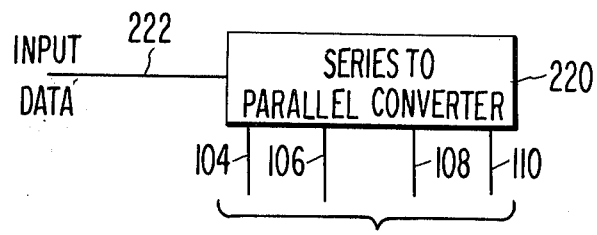
FIG. 4 is a block diagram illustrating a means for converting serial input data into parallel form.

The present invention may be used in systems utilizing either parallel or serial formated signals. FIG. 4 illustrates an arrangement for converting serial formated signals into parallel form. A series-to-parallel converter 220 receives input data in serial format over path 222 and converts such data into parallel form generating signals corresponding to the BCD tenth's, unit's, ten's and hundredth's over paths 104, 106, 108, and 110 respectively. These signals may be applied to the converter illustrated in FIG. 2 at the conductor paths for receiving the input BCD distance data.

What is claimed is:

1. A digital-to-synchro converter including input means for receiving input data in the form of digital signals representing distance, said converter being suitable for driving a synchro receiver of the type having stator windings spatially separated in predetermined phase relation and a rotor rotatable an angular displacement proportional to the linear distance represented by said digital signals, the windings of said synchro receiver being adapted for excitation by sinusoidal voltages at a first frequency, comprising in combination:
    a. a voltage source for providing a sinusoidal reference signal at said first frequency,
    b. means responsive to said sinusoidal reference signal for generating a square wave reference signal at said first frequency,
    c. means for coupling said sinusoidal reference signal to said rotor for energizing said rotor,
    d. phase locked loop means responsive to said square wave signal for generating a first clock signal,
    e. divider means responsive to said first clock signal for generating a second clock signal at a frequency that is a selected fraction of said first clock signal,
    f. variable delay means responsive to said digital signals, to said square wave reference signal and to said second clock signal, for generating a variable delayed signal delayed, relative to said square wave reference signal, a phase angle proportional to the distance represented by said digital signals,
    g. fixed delay means responsive to said variable delayed signal and to said first clock signal for generating a first delay signal having a phase angle summed from said variable delayed signal phase angle and a first fixed delay phase angle, and for providing a second delay signal having a phase angle summed from said variable delayed signal phase angle and a second fixed delay phase angle, said first and second fixed delay phase angles being related to the phase separation of said stator windings such that in the absence of said variable delayed signal said rotor is oriented in a position corresponding to zero distance,
    h. sampling means for sampling said sinusoidal reference signal in response to said first and second delay signals for generating a pair of D.C. signals each having a magnitude respectively representing a trigonometric function of the respective phase angles of said first and second delayed signals, and
    i. analogue multiplying means for multiplying said pair of D.C. signals with said sinusoidal reference signal for generating a control signal for said synchro receiver stator windings to effect step-wise rotation of the rotor thereof an angular displacement corresponding to said distance represented by said digital signals, the magnitude of each of said steps being determined by said second clock signal.

2. A converter according to claim 1 wherein the amplitudes of said pair of D.C. signals are proportional, respectively, to the sine of the sum of the variable delayed signal and said first delay signal and said second delay signal.

3. A converter according to claim 1 wherein the frequency of said sinusoidal and square wave reference signals is 400 Hz, of said first clock signal is 120 kHz and said second clock is 40 kHz, whereby there are 100 steps for each rotation of said rotor.

4. A converter according to claim 1 wherein the frequency of said sinusoidal and square wave reference signals is 400 Hz, of said first clock signal is 120 kHz and said second clock is 4 kHz, whereby there are 10 steps for each rotation of said rotor.

* * * * *